United States Patent
Kashiwaya et al.

[11] Patent Number: 5,935,335
[45] Date of Patent: Aug. 10, 1999

[54] FILM-FORMING APPARATUS AND FILM-FORMING METHOD

[75] Inventors: Makoto Kashiwaya; Junji Nakada, both of Kanagawa, Japan

[73] Assignee: Fuji Photo Film Co., Ltd., Japan

[21] Appl. No.: 08/815,053

[22] Filed: Mar. 11, 1997

[30] Foreign Application Priority Data

Mar. 11, 1996 [JP] Japan ......................................... 8-53371

[51] Int. Cl.⁶ .................................................. H05H 1/00
[52] U.S. Cl. .......................... 118/723 MR; 118/723 MA; 118/718
[58] Field of Search .................. 118/723 MR, 723 MW, 118/723 MA, 718, 730; 204/298.37, 298.38; 156/345; 315/111.41, 111.71

[56] References Cited

U.S. PATENT DOCUMENTS

| | | | |
|---|---|---|---|
| 5,021,114 | 6/1991 | Saito et al. | 156/345 |
| 5,034,086 | 7/1991 | Sato | 156/345 |
| 5,232,791 | 8/1993 | Kohler et al. | |
| 5,360,483 | 11/1994 | Kurokawa et al. | |
| 5,466,295 | 11/1995 | Getty | 118/723 MA |
| 5,523,126 | 6/1996 | Sano et al. | 118/723 MW |

FOREIGN PATENT DOCUMENTS 7-100857  4/1987  Japan.
7-51753   3/1988  Japan.

*Primary Examiner*—Thi Dang
*Attorney, Agent, or Firm*—Brinks, Hofer, Gilson & Lione

[57] ABSTRACT

A film-forming apparatus for making it possible to form a thin film on a web-like high-molecular film substrate, comprising: a vacuum chamber provided with an evacuator; a gas introducing member for introducing a thin-film-forming gas into the vacuum chamber; a plasma generating member for generating plasma in the vacuum chamber; a substrate carrying member for carrying the substrate to the neighborhood of the plasma generated by the plasma generating member; and a bias voltage applying member for applying a desired bias voltage to the substrate. The plasma generating member is constituted by a microwave ECR plasma generating member including a microwave generating member for generating microwave, a microwave introducing and propagating member for coaxially introducing the generated microwave into the vacuum chamber and radially propagating the microwave in the vacuum chamber, and permanent magnets provided in the vacuum chamber for forming a magnetic field to cause electron cyclotron resonance with the introduced and propagated microwave.

4 Claims, 3 Drawing Sheets

FILM-FORMING APPARATUS AND FILM-FORMING METHOD

BACKGROUND OF THE INVENTION

The present invention relates to a film-forming apparatus and a film-forming method adapted for forming a thin film on a high-molecular film as a substrate by a gas-phase reaction using plasma.

High-density magnetic recording media such as a metal vapor deposition tape used as a high-quality video tape, a hard disk or high-density floppy disk used as a large storage capacity storage for a computer, etc., and other magnetic recording media have been further developed into higher-density media recent years.

For example, there are used a metal vapor deposition tape for a digital video camera and a floppy disk having a recording capacity of 100 [MB] or a hard disk having a recording capacity of the order of GB (gigabyte) as a storage device for a computer.

Because the floppy disk uses a web-like high-molecular film as its high-molecular substrate, the productivity of the floppy disk is very high compared with those of a hard disk and an optical disk which use a fixed substrate in the producing process, As a method of improving the recording density of the floppy disk more greatly, there is thought of a configuration in which a metal such as CoNi, CoNiPt, CoCrPt, CoCrTa, CoCrPtSi, SmCo, etc., is formed as a magnetic film.

Further, a material of a protective film for protecting the metal magnetic film is required to have a characteristic excellent both in hardness and in slidability. Examples of the material having such a characteristic include SiNr, $SiO_2$, TiN, BN, CN, a-C, diamond-like carbon (DLC), etc.

In this case, as a method of forming a protective film by using the aforementioned material, there are known a method of forming a carbon protective film by sputtering and a method of forming a protective film by plasma CVD. Because, in comparison on film-forming speed, the sputtering method is extremely slower than the plasma CVD method, it is preferable to employ the plasma CVD type method, taking the productivity or the like into consideration.

In the plasma CVD method, it is known that the amount of the decomposed reaction gas increases to thereby increase the film-forming speed as the number of electrons in plasma increases and as the density of the plasma increases, because molecules of the reaction gas are excited and ionized to cause a decomposing reaction by the collision of the reaction gas with electrons in the plasma so that a thin film is formed on a substrate by a gas-phase reaction, that is, a protective film is formed.

As a plasma generating method using plasma CVD, there are known a DC arc discharge method, a high-frequency discharge method, etc. The density of plasma varies greatly in accordance with the plasma generating method, The plasma density in the high-frequency discharge method is in a range of about from the order of $10^9$ [/cc] to the order of $10^{10}$ [/cc] whereas the plasma density in the DC arc discharge method is in a range of about from the order of $10^{11}$ [/cc] to the order of $10^{12}$ [/cc].

Accordingly, in comparison on plasma density, the DC arc discharge method is superior in that film-forming can be performed at a high speed. However, plasma generated by the DC arc discharge method is called "equilibrium plasma" and is very high in ion temperature so that it is difficult to produce good-quality magnetic recording media because a high-molecular film is thermally damaged by the radiant heat of plasma in the case where tho high-molecular film is used as a substrate.

For example, in "DC Arc Discharge CVD Apparatus" disclosed in U.S. Pat. No. 5,232,791 or in "DC Arc Discharge CVD Apparatus" disclosed in Japanese Patent Postexamination Publication No. Hei-7-51753, the density of plasma is high and these apparatuses are therefore suitable for high-speed film-forming with respect to this point. It is however known that, when a high-molecular film such as a PET film, a PEN film, an aramid film, a polyimide film, etc., is used as a substrate, the substrate is seriously damaged by the radiant heat of plasma because the temperature of the plasma is high. Accordingly, these apparatuses are not suitable for production of good-quality magnetic recording media.

On the other hand, when discussion was made upon "High-frequency CVD Apparatus" disclosed in U.S. Pat. No. 5,360,483 and "High-frequency CVD Apparatus" disclosed in Japanese Patent Postexamination Publication No. Hei-7-100857 using the high-frequency discharge method, there was found a problem that the density of plasma is low and the film-forming speed is low as described above.

In the "High-frequency CVD Apparatus" described in the above U.S. Pat. No. 5,360,483, because a reaction tube is used, the film thickness distribution in the widthwise direction is poor so that the apparatus is not suitable for a continuous substrate such as a high-molecular film. On the other hand, in the "High-frequency CVD Apparatus" disclosed in Japanese Patent Postexamination Publication No. Hei-7-100657, because slag is accumulated between a film-forming drum and an electrode in the case where film-forming is performed continuously, the surface of the substrate is injured easily so that it is not preferable to use the apparatus in a process of forming a film on a long-size high-molecular film.

Judging from the above description as a whole, what is meant is that nonequilibrium and low-temperature plasma is required in the case where a high-molecular film is used as a substrate and that a plasma source satisfying the condition of high plasma density is required for improving productivity.

Therefore, employment of a microwave ECR plasma CVD apparatus using micro ECR (electron cyclotron resonance) as a plasma generating method is thought of. In this case, it is known that generated plasma is low-temperature nonequilibrium plasma and that the density of the plasma is in a range of about from the order of $10^{11}$ [/cc] to the order of $10^{12}$ [/cc]. In this regard, film-forming can be performed both at a low temperature and at a high speed so that the merit of the DC arc discharge method and the merit of the high-frequency discharge method can be made consistent with each other.

FIG. 3 shows a conventional microwave ECR plasma CVD apparatus 100 (hereinafter simply referred to as "apparatus 100") as described above. As understood from FIG. 3, the apparatus 100 has a vacuum chamber 110 in which the inside gas is drawn out from an outlet 120. In the inside of the vacuum chamber 110, there are provided a delivery portion 140 for delivering a substrate 130 to a protective-film-forming region in order to carry the substrate 130, an electrode roller 130 for applying a bias voltage to the substrate 130, a cooling drum 160 for cooling the substrate 130 in the protective-film-forming region, a pass roller 170, a wind-up portion 180 for winding up the substrate 130 after the formation of the protective film, and a reaction gas introducing portion 190 for introducing a protective-film-forming gas into the vacuum chamber 110.

In the outside of the vacuum chamber 110, there is provided a microwave generating portion 200 for generating microwave. The generated microwave is propagated into a plasma generating chamber 230 through a microwave introducing portion 210 and a microwave introducing window 220. A plasma-generating inert gas is introduced into the plasma generating chamber 230 from an inert gas introducing portion 240.

In the outside of the plasma generating chamber 230, there is provided a plurality of current coils 250 to form a magnetic field for generating plasma. By the configuration, electron cyclotron resonance is applied to the introduced inert gas so that the substantially same number of nonequilibrium low-temperature plasma au that obtained by the arc discharge method is generated.

Because the apparatus 100, however, uses the large-size current coils 250 in order to form a magnetic field for ECR, the distribution of the magnetic field thus formed becomes uneven. As a result, there arises a serious disadvantage that film-forming cannot be performed over a large area and, particularly, the film thickness distribution in the widthwise direction becomes poor.

Although, in this case, such a configuration in which a number of current coils 250 are used so that the magnetic field formed in the vacuum chamber 110 is made uniform may be employed, there arises a problem that the cost of production of the apparatus 100 as a whole is increased. Furthermore, even if the magnetic field is intended to be made even as described above, the degree of evenness is insufficient to make the film thickness distribution good with respect to the high-molecular substrate in the form of a web-like high-molecular film.

Furthermore, in the case where microwave is introduced into the vacuum chamber 110, a protective film and slag which is generated in film-forming are not transparent and are deposited on the microwave introducing window 220 to contaminate the microwave introducing window 220 because there is employed a configuration in which the dielectric microwave introducing window 220 is interposed in a microwave propagation path. As a result, the output of microwave supplied for plasma generation is lowered. Accordingly, when a long-size film is used as the substrate 130, the film thickness in the lengthwise direction of the substrate 130 varies largely so that the film thickness cannot be made even. As a result, sufficiently good quality cannot be obtained.

SUMMARY OF THE INVENTION

An object of the present invention is to provide a film-forming apparatus and a film-forming method in which, even in the case where web-like high-molecular film is used as a substrate, the substrate is less damaged and film-forming can be performed at a high speed particularly with good film-thickness distribution in the widthwise direction.

The above object can be attained by a film-forming apparatus for making it possible to form a thin film on a web-like high-molecular film substrate, comprising: a vacuum chamber provided with an evacuator; a gas introducing means for introducing a thin-film-forming gas into the vacuum chamber; a plasma generating means for generating plasma in the vacuum chamber; a substrate carrying means for carrying the substrate to the neighborhood of the plasma generated by the plasma generating means; and a bias voltage applying means for applying a desired bias voltage to the substrate; wherein the plasma generating means is constituted by a microwave ECR plasma generating moans including a microwave generating means for generating microwave, a microwave introducing and propagating means for coaxially introducing the generated microwave into the vacuum chamber and radially propagating the microwave in the vacuum chamber, and permanent magnets provided in the vacuum chamber for forming a magnetic field to cause electron cyclotron resonance with the introduced and propagated microwave.

Preferably, in the above film-forming apparatus, positions of the film-forming apparatus exposed to plasma being contained in the plasma generated by the plasma generating means and having no contribution to film-forming and positions of the film-forming apparatus in which microwave being contained in the microwave generated by the microwave generating means and having no contribution to film-forming is propagated are coated with an electrically insulating material.

The above object can be attained also by a film-forming method for forming a thin film by a film-forming apparatus for making it possible to form a thin film on a web-like high-molecular film substrate, the apparatus comprising a vacuum chamber provided with an evacuator, a gas introducing means for introducing a thin-film-forming gas into the vacuum chamber, a plasma generating means for generating plasma in the vacuum chamber, a substrate carrying means for carrying the substrate to the neighborhood of the plasma generated by the plasma generating moans, and a bias voltage applying means for applying a desired bias voltage to the substrate, the plasma generating means being constituted by a microwave ECR plasma generating means including a microwave generating means for generating microwave, a microwave introducing and propagating means for coaxially introducing the generated microwave into the vacuum chamber and radially propagating the microwave in the vacuum chamber, and permanent magnets provided in the vacuum chamber for forming a magnetic field to cause electron cyclotron resonance with the introduced and propagated microwave, wherein the method comprising the steps of: introducing an inert gas while differentially evacuating the vacuum chamber; radially propagating microwave generated by the microwave generating means into the vacuum chamber containing the introduced inert gas and, at the same time, generating electron cyclotron resonance between a magnetic field formed by the permanent magnets and the propagated microwave to thereby generate plasma; introducing a thin-film-forming reaction gas into the generated plasma by the gas introducing means and exciting and ionizing the reaction gas to thereby cause a decomposing reaction; and carrying the substrate to the neighborhood of the plasma by the substrate carrying means while applying a bias voltage onto the substrate by the bias voltage applying means so that a desired thin film is formed by a gas-phase reaction of the reaction gas.

Preferably, in the above method, a metal layer formed from a ferromagnetic material is formed on the substrate in advance, the bias voltage is applied to the metal layer by the bias voltage applying means, and, at the same time, the reaction gas is formed from hydrocarbon so that the thin film mainly containing carbon is formed.

In the aforementioned embodiment of the film-forming method, the reaction gas is formed from hydrocarbon and the pressure range of the reaction gas in the condition in which the thin film is formed is preferably selected to be in a range of from $1\times10^{-4}$ [Torr] to $1\times10^{-2}$ [Torr], more preferably in a range of from $5\times10^{-4}$ [Torr] to $5\times10^{-3}$ [Torr].

Further, in the aforementioned embodiment of the film-forming method, the reaction gas introduced for thin-film formation is preferably formed from hydrocarbon having a bonding portion in which atoms are bonded to each other with interatomic bond energy in a range of from 4 [eV] to 12 [eV], preferably in a range of from 5 [eV] to 10 [eV].

In the aforementioned film-forming apparatus, microwave radially propagated in the vacuum chamber makes electron cyclotron resonance with a magnetic field which is formed by the permanent magnets, so that plasma is generated to thereby perform film-forming.

Furthermore, in the aforementioned film-forming apparatus, positions of the film-forming apparatus exposed to plasma contained in the generated plasma and hiving no contribution to film-forming and positions of the film-forming apparatus in which microwave contained in the microwave generated by the microwave generating means and having no contribution to film-forming is propagated are coated with an electrically insulating material so as to be protected.

On the other hand, in the aforementioned film-forming method, microwave generated by the microwave generating means is radially propagated into the vacuum chamber containing the introduced inert gas to cause electron cyclotron resonance with the magnetic field formed by the permanent magnets to thereby generate plasma. A thin-film-forming reaction gas is introduced into the generated plasma by the gas introducing means and is excited and ionized to cause a decomposing reaction. On the other hand, the substrate is carried to the neighborhood of the plasma by the substrate carrying means while a bias voltage is applied onto the substrate by the bias voltage applying means, so that a desired thin film is formed by a gas-phase reaction of the reaction gas.

Further, in the aforementioned film-forming method, not only a metal layer formed from a ferromagnetic material is formed on the substrate in advance so that the bias voltage is applied to the metal layer by the bias voltage applying means but also the reaction gas is formed from hydrocarbon so that the thin film mainly containing carbon is formed.

Further, in the aforementioned film-forming method, the reaction gas is formed from hydrocarbon and the pressure of the reaction gas in the condition in which the thin film is formed is preferably selected to be in a range of from $1\times10^{-4}$ [Torr] to $1\times10^{-2}$ [Torr], more preferably in a range of from $5\times10^{-4}$ [Torr] to $5\times10^{-3}$ [Torr]. That is, film-forming is performed while the pressure of the reaction gas is kept in the selected range.

Further, in the aforementioned film-forming method, as the attribute of the reaction gas introduced for thin-film formation, hydrocarbon having a bonding portion of interatomic bond energy of not less than 5 [eV] is used for film-forming.

DESCRIPTION OF THE PREFERRED EMBODIMENTS

Preferred embodiments of a film-forming apparatus and a film-forming method according to the present invention will be described below in detail with reference to the drawings.

A magnetic recording medium producing apparatus to which the film-forming apparatus according to the present invention is applied will be described first.

Figure 1:
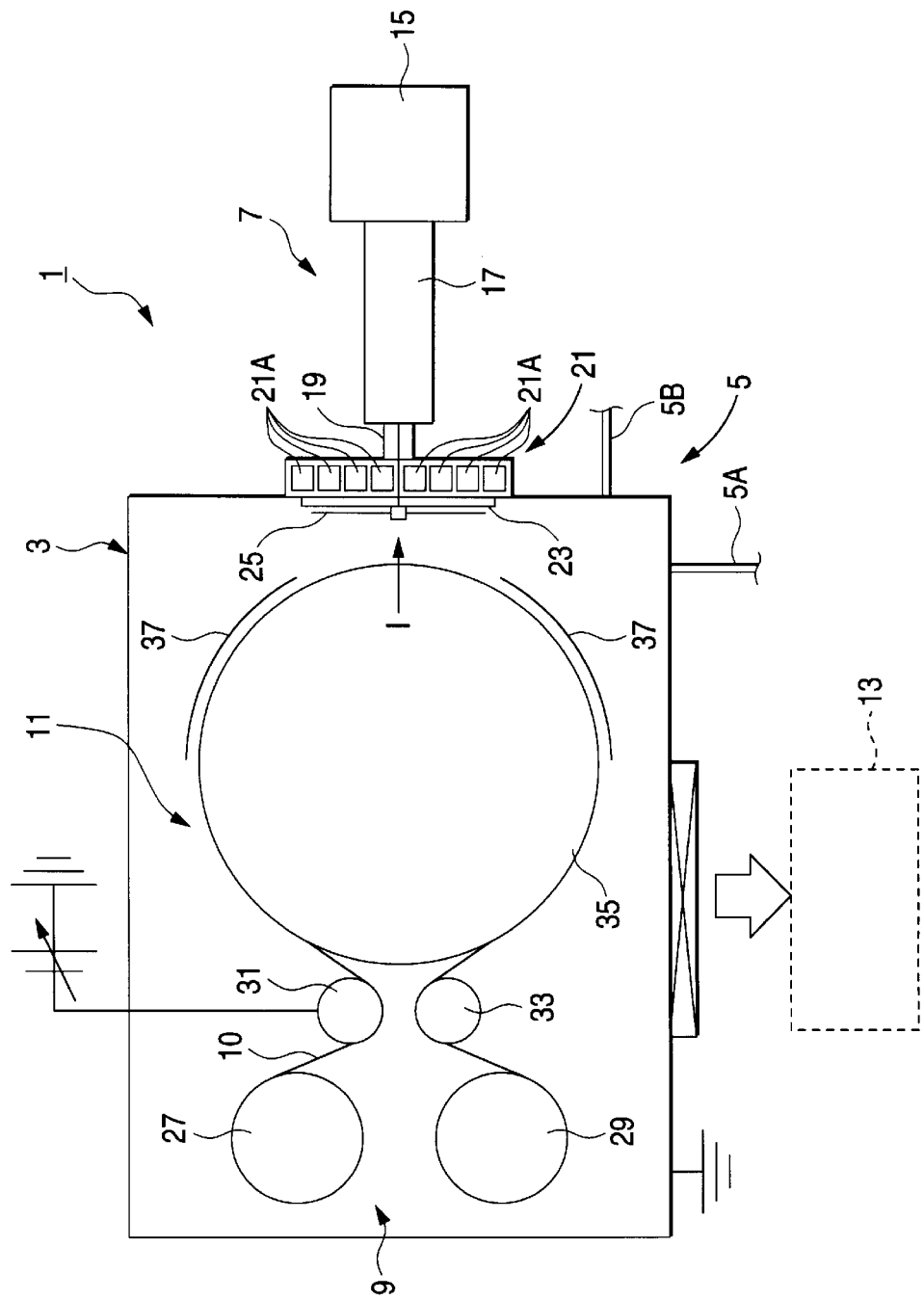
FIG. 1 is a schematic configuration view showing the whole of the magnetic medium producing apparatus to which the film-forming apparatus is applied.

FIG. 1 is an overall schematic structural view of a magnetic recording medium producing apparatus (hereinafter simply referred to as "apparatus") 1. As understood from FIG. 1, the apparatus 1 is a microwave ECR plasma CVD apparatus in which a web-like high-molecular film is used as a substrate (high-molecular substrate) 10 so that a protective film, as one example of thin film, can be formed on the substrate 10 by using plasma generated by microwave ECR discharge.

Incidentally, the substrate 10 is formed from a high-molecular film such as a PEN film, a PET film, an aramid film, a polyimide film, or the like, which is used as a material for forming a floppy disk, or the like.

The apparatus 1 mainly comprises a vacuum chamber 3 for holding the substrate 10 under an environment for forming a protective film, a gas introducing means 5 for introducing a protective-film-forming gas and an inert gas into the vacuum chamber 3, a microwave ECR plasma generating means 7 for generating a great deal of nonequilibrium low-temperature plasma (as much as that in an arc discharge method), a substrate carrying means (high-molecular substrate carrying apparatus) 9 for carrying the substrate 10 from a predetermined position to another predetermined position through a protective-film-forming space (plasma generating region), and a bias voltage applying means 11 for applying a predetermined bias voltage to the substrate 10 at the time of forming a protective film.

The vacuum chamber 3 is formed from a nonmagnetic material such as stainless steel SUS304, or the like, so that the magnetic field (which will be described later) for generating plasma does not suffer from disturbance. The inside pressure of the vacuum chamber 3 is on the condition that initial evacuation ultimate pressure is not higher than $2\times10^{-5}$ [Torr], preferably not higher than $2\times10^{-6}$ [Torr]. Further, the vacuum chamber 3 has such vacuum sealing performance that its inside pressure is kept in a range of from $1\times10^{-4}$ [Torr] to $1\times10^{-2}$ [Torr] during film-forming.

Further, the vacuum chamber 3 is evacuated by a vacuum evacuation pump system 13 which is formed from a combination of a rotary pump, a mechanical booster pump and a turbo pump (which are not shown). The turbo pump may be replaced by a diffusion pump or the evacuating capacity of the pump system, the number of pumps used in the pump system, and so on, can be selected suitably correspondingly to the internal volume of the vacuum chamber 3.

Further, in the case where the evacuating speed is to be adjusted, there is a configuration in which a bypass piping is provided so as to be interposed in an evacuation path so that the evacuating speed is changed and adjusted by the resistance of the bypass piping, or an orifice valve may be provided so as to be interposed in the evacuation path so that the evacuating speed is changed and adjusted by the adjustment of the opening degree of the orifice valve.

Next, the gas introducing means 5 is provided with a reaction gas introducing portion 5A for introducing a protective-film-forming reaction gas into the vacuum chamber 3 and with an inert gas introducing portion 5B for introducing a plasma-generating inert gas into the vacuum chamber 3. A mass flow controller (not shown) is used for controlling the flow rate of each of the gases. The mass flow controller is configured so that its gas introduction position is vacuum-sealed, for example, by using an SUS pipe while the gas is introduced into the vacuum chamber 3. The mass flow controller is set so that the gas is jetted to the neighborhood of the plasma generating region in the vacuum chamber 3.

In this case, the positions of gas jetting (blowout) from the gas introducing portions 5A and 5B are optimized so as to exert no influence on the plasma distribution. Particularly, the position of blowout of the protective-film-forming reaction gas is preferably optimized correspondingly to the position of the web-like substrate 10 because the blowout position has an influence also on tho thickness distribution of the protective film.

Examples of tho plasma-generating inert gas include He, Ne, Ar, Kr, Xe, and so on. Particularly because Ar is more available and cheaper than the other gases, the cost of production of a magnetic recording medium having a protective film formed can be reduced by using Ar.

On the other hand, preferred examples of the protective-film-forming reaction gas include hydrocarbon gases such as $CH_4$, $C_2H_6$, $C_3H_8$, $C_2H_2$, $C_6H_6$ (benzene), etc. Particularly because $C_2H_2$, $C_6H_6$, or the like, has a portion in which atoms are bonded with bonding energy of not lower than 5 [eV], a hydrocarbon gas having such an attribute is preferably selected.

Figure 2:
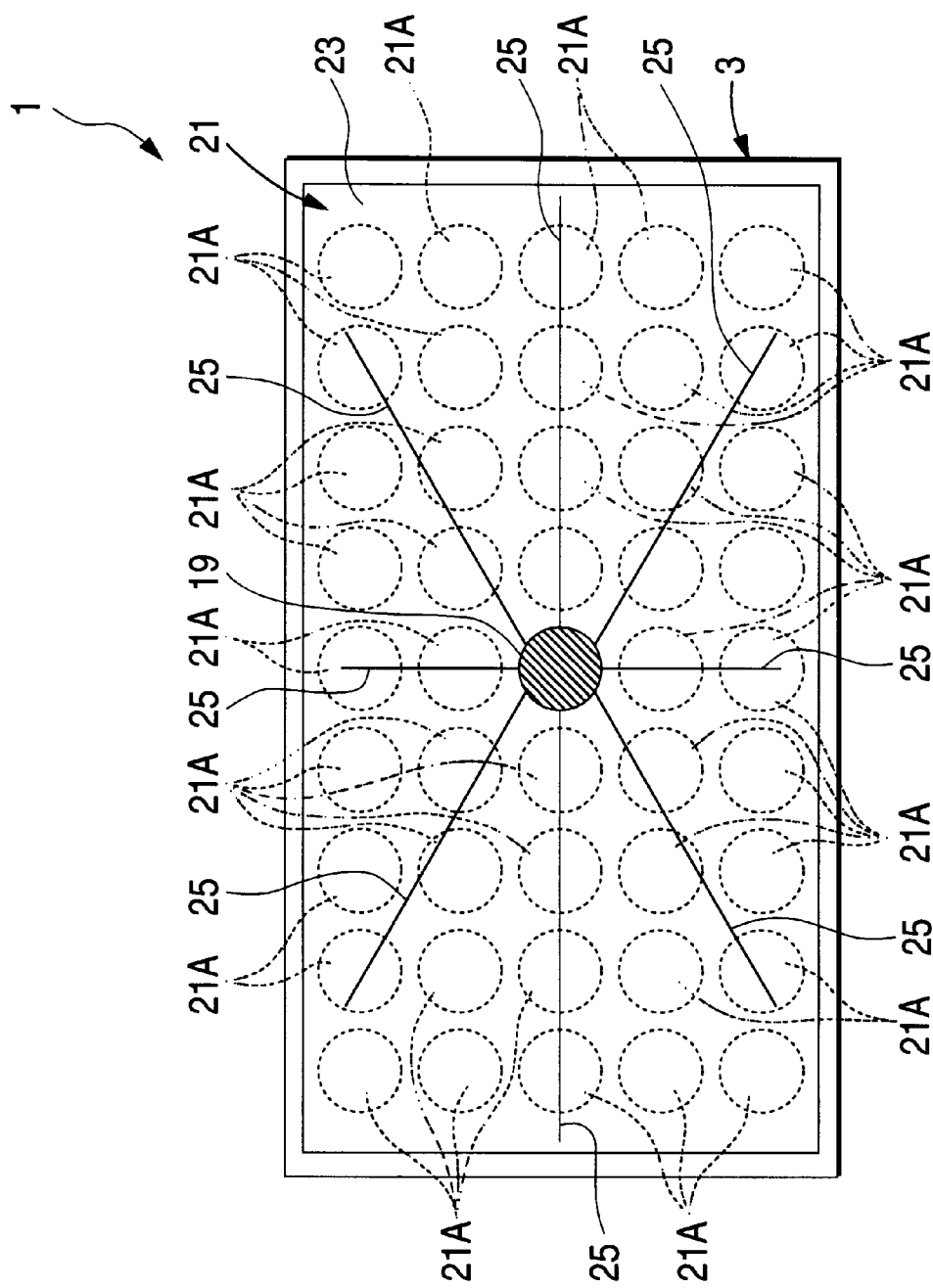
FIG. 2 an explanatory view showing the configuration of antenna, etc. in the direction of arrows I in FIG. 1.
Figure 3:
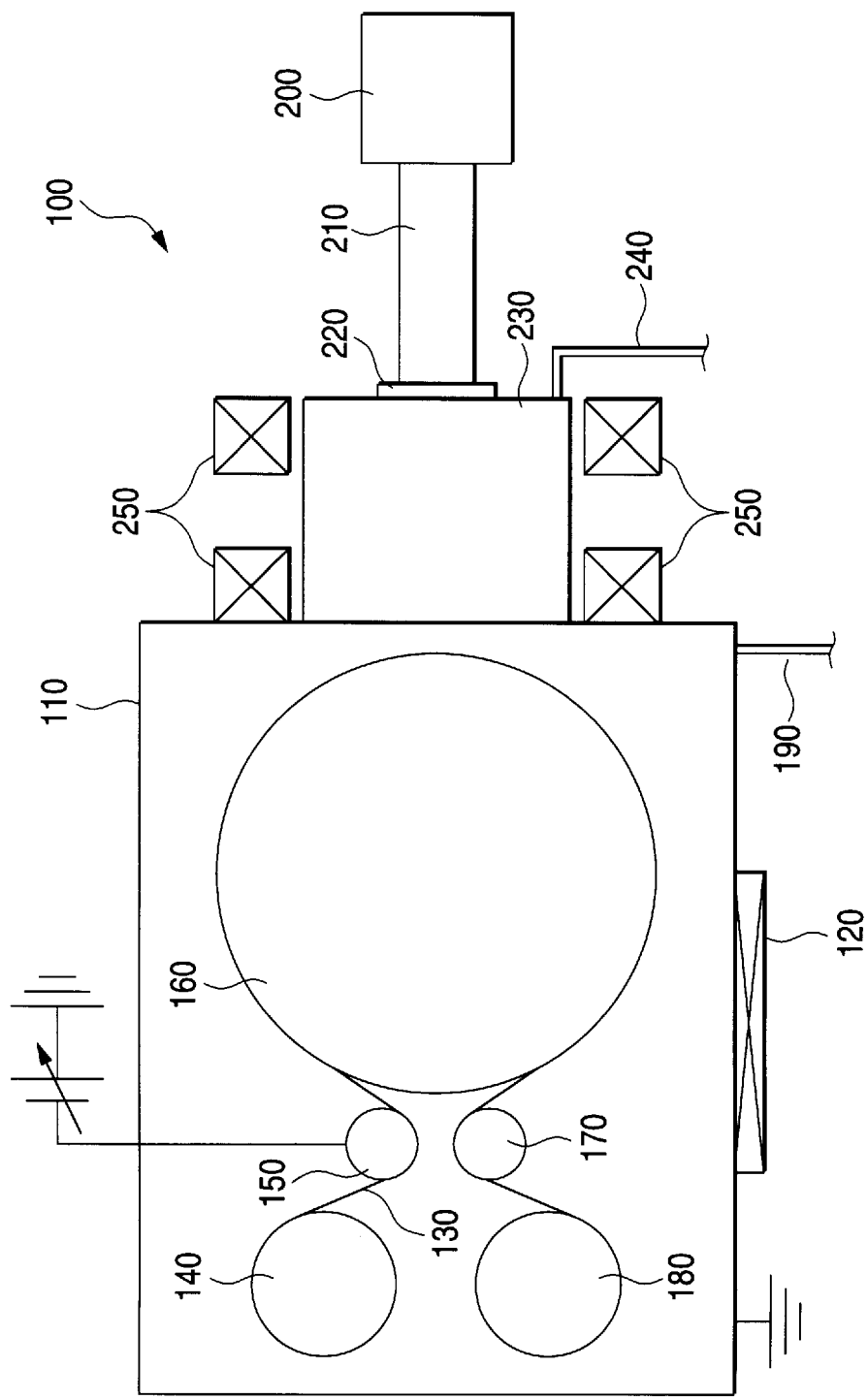
FIG. 3 is a schematic configuration view showing the whole of a conventional microwave ECR plasma CVD apparatus.

As understood from FIG. 1 and FIG. 2 which is a view from the arrow I in FIG. 1, the microwave ECR plasma generating means 7 includes a microwave generating portion 15 for generating microwave by a known means, a microwave introducing portion 17 for propagating the generated microwave into the vacuum chamber 3, and a coaxially introducing portion 19 for adjusting the propagated microwave coaxially before propagating the microwave radially into the vacuum chamber 3.

In this case, a microwave generating electric source having a frequency in a range of from 1 [GHz] to 10 [GHz] and having a maximum output in a range of from 1 [kw] to 5 [kw] is used suitably. Industrial electric power (having a frequency of 2.45 [GHz] and having a maximum output in a range of from 1 [kw] to 3 [kw]) is particularly preferably used with an advantage that the operating cost of the apparatus 1 can be waved compared with electric sources of other frequency band at a high charge in power consumption.

Further, a known waveguide is used as the microwave introducing portion 17. The waveguide may be formed from a JIS-standardized (Japanese Industrial Standard) material. A not-shown microwave reflection absorbing device, a microwave matching device and a power motor are provided in the waveguide path (propagating path) in the waveguide. In the coaxially introducing portion 19, the microwave between the waveguide and tho vacuum chamber 3 is coaxially converted and coaxially introduced into the vacuum chamber 3.

Incidentally, the vacuum sealing portion, etc. in the coaxially introducing portion 19, or the like, as heated by heat generation due to the microwave are set so as to be cooled by a suitable means but the description of the means will be omitted because the means is known conventionally.

Further, the microwave ECR plasma generating means 7 includes a magnetic-field-forming means 21 constituted by a plurality of permanent magnets 21A arranged like a matrix having a desired number of rows and a desired number of columns in the microwave-propagating-direction forward end position of the coaxially introducing portion 19, a dielectric plate 23 provided in the vacuum chamber 3 so as to be opposite to the permanent magnets 21A, and a radial antenna 25 provided in front of the dielectric plate 23 and formed from a plurality of antenna bodies 25A arranged radially. The dielectric plate 23 is formed from a dielectric material such as quartz, or the like, and has a function for preventing plasma from being generated between the radial antenna 25 and the inner wall of the vacuum chamber 3.

Each of the permanent magnets 21A is formed from a ferromagnetic material such as SmCo, or the like, and is set so that a very intensive magnetic field can be formed. Although this embodiment shows the case where the permanent magnets are arranged in the form of a matrix (rectangularly), the present invention may be preferably applied also to the case where the permanent magnets are arranged concentrically.

On the surfaces of the thus arranged permanent magnets 21A (magnetic field forming means 21), a magnetic field having an intensity (flux density) in a range of about from 500 [Gauss] to 2000 [Gauss] is formed. Further, the arrangement posture of the magnetic field forming means 21 is set correspondingly to the shape of a cooling drum 35 (which will be described later) provided so as to be opposite to the magnetic field forming means 21. In this embodiment, the flux density toward the cooling drum 35 is set so as to be nearly 875 [Gauss].

Further, the length in each of the antenna bodies 25A of the radial antenna 25 is selected to be an odd-number multiple of $(¼)\lambda$ or $(⅛)\lambda$ when $\lambda$ in the wavelength of the microwave. For example, the respective antenna bodies 25A are configured so as to be spread in four directions, in eight directions, or the like from the center of radiation. Further, it is preferable, from the viewpoint of evenness of plasma, that the length of each of the antenna bodies and the number of the antenna bodies are selected suitably (refer to Examples which will be described later).

Incidentally, when, for example, the microwave introducing portion 17 is shaped like a broad angle, a configuration in which the microwave guide is divided into two systems in the middle so that the microwave splits thus obtained are axially introduced, respectively, can be employed in the arrangement of the coaxially introducing portion 19 and the radial antenna 25.

Further, in the formation of the magnetic field, besides the magnetic field forming means 21, for example, a magnetic field in a range of about from 50 [Gauss] to 100 [Gauss] may be superposed from the outside of the vacuum chamber 3 to thereby entrap plasma to make it possible to form a film at a higher speed.

Further, in this embodiment, not only the respective positions of the vacuum chamber 3 are coated with a desired electrically insulating material (not shown) formed from plastics such as MC (monomer casting) Nylon, Teflon, or the like, or formed from a PEN (polyethylene naphthalate) film, a PET (polyethylene naphthalate) film, or the like, but also the positions not requiring the propagation of the microwave are coated with the desired electrically insulating material so that plasma which are contained in the plasma generated in tho vacuum chamber 3 and which have no contribution to the formation of the protective film is prevented from colliding with the respective positions of the vacuum chamber 3.

This is because there is a possibility that devices constituting the apparatus 1 may be damaged or defeats such as pinholes or the like may be generated in the substrate 10 after the formation of the protective film as a finished product by the occurrence of an arc if there is some electrically insulating portion locally when microwave ECR discharge is utilized. The cause thereof is insulation breakdown generated when the microwave propagates into the vacuum chamber 3. Accordingly, if the neighborhood of the position where insulation breakdown may be easily generated is coated with an electrically insulating material, the generation of arc can be prevented from occurring to thereby prevent and various kinds of disadvantages can be avoided.

Next, the substrate carrying means 9 includes a delivery portion 27 serving as a mechanism for delivering the web-like substrate 10, a wind-up portion 29 serving as a mechanism for winding up the substrate 10 having the protective film formed, and a path roll 33 for carrying the substrate 10 to the neighborhood of plasma. In the downstream position of the delivery portion 27 in the direction of carrying tho substrate 10, there is provided the bias voltage applying means 11 mainly containing an electrode roll 31 for applying a desired bias voltage to the substrate 10.

Incidentally, a configuration is suitable in which an EXP roll, or the like, is used in order to eliminate creases which occur in the substrate 10 in carrying. Further, a cooling drum 35 may be disposed in the film-forming region so that film-forming can be performed while the substrate 10 is made to run along the outer circumferential surface of the cooling drum 35. This may be selected suitably. Further, a suitable mask member 37 may be preferably disposed in the film-forming region so that the protective film material is not deposited on the unnecessary portion in which the protective film must not be formed originally.

The bias voltage applying means 11 is provided as a DC electric source for generating a negative voltage as a bias source to be applied to the substrate 10. A negative DC electric source or a high-frequency electric source pulse-modulated in a range of from 2 [kHz] to 20 [kHz] is used as the bias voltage applying means 11. In this case, there is a merit that the operating cost of the apparatus 1 can be saved when an industrial electric source of 13.56 (MHz) at a low charge of electric power is used as the high-frequency electric source, but electric sources of other frequencies may be used.

In the apparatus 1 configured as described above, a microwave ECR plasma generator using a magnetic field forming means 21 constituted by a plurality of permanent magnets 21A is applied to thereby make it possible to form the apparatus 1 as a plasma CVD apparatus in which; the substrate 10 formed from a web-like high-molecular film is less damaged; the widthwise film thickness is made uniform at a high speed; and the cost of the apparatus 1 can be reduced. The technique for generating plasma by a magnetic field due to permanent magnets is known from "ECR type Plasma Generator" disclosed in Japanese Patent Unexamined Publication No. Hei-6-310494, etc. and the description of the technique will be omitted.

As described above, in the film-forming apparatus 1 according to this embodiment, electron cyclotron resonance occurs in microwave which is radially propagated in the vacuum chamber 3 by the magnetic field formed by the magnetic field forming portion 21 constituted by the plurality of permanent magnets 21A, so that a large deal of nonequilibrium low-temperature plasma are generated as much as that generated by an arc discharge method and film-forming is performed by the plasma.

Accordingly, also when a web-like high-molecular film is used as the substrate 10 the plasma temperature is low so that film-forming can be performed in the condition in which the substrate 10 is less damaged and particularly the film thickness distribution in the widthwise direction of the substrate 10 is good and, furthermore, a great deal of plasma are generated so that film-forming is performed at a high speed.

Further, because respective positions of the film-forming apparatus 1 exposed to plasma contained in the generated plasma and having no contribution to film-forming and respective positions of the film-forming apparatus 1 in which microwave contained in the microwave generated by the microwave generating means 7 and having no contribution to film-forming propagate are coated and protected with an insulating material, not only the durability of the film-forming apparatus 1 can be improved but also long-term continuous film-forming can be performed.

A preferred embodiment of the film-forming method according to the present invention will be described below with reference to the drawings.

In this embodiment, the aforementioned apparatus 1 is used so that a protective film, as one example of thin film, is formed on the substrate 10.

In the first step, the vacuum chamber 3 is differentially evacuated by the vacuum pump 13 and the gas introducing portion 5B of the gas introducing means 5 so that the aforementioned inert gas is introduced.

Then, in the second step, microwave generated by the microwave generating means 7 is radially propagated into the vacuum chamber 3 containing the introduced inert gas and, at the same time, electron cyclotron resonance is generated in the propagated microwave by a magnetic field formed by the magnetic field forming means 21 constituted by the plurality of permanent magnets 21A. As a result, a great deal of nonequilibrium low-temperature plasma are generated as much as that generated by an arc discharge method.

Next, in the third step, a thin-film-forming reaction gas is introduced into the generated plasma by the gas introducing portion 5A of the gas introducing means 5, so that the reaction gas is excited and ionized to cause a decomposing reaction.

Then, in the fourth step, the substrate 10 is carried to the neighborhood of the plasma along the outer circumferential surface of the cooling drum 35 by the substrate carrying means 9 while a desired bias voltage is applied to the substrate 10 as a web-like high-molecular film by the bias voltage applying means 9, so that a desired thin film, that is, a protective film is formed by the gas-phase reaction of the reaction gas.

In this case, a diamond-like carbon film excellent both in hardness and in slidability is promising as the protective film for high-density magnetic media. In this embodiment, hydrocarbon is used as the reaction gas for forming the diamond-like carbon film so that a metal layer (refer to Examples which will be described later) formed from a ferromagnetic material is formed on tho substrate 10 in advance and then a protective film is formed while a bias voltage is applied to the metal layer.

As a result of discussion made by the inventors of the present invention, it was found that the pressure of the reaction gas which was subjected to film-forming in the plasma CVD apparatus using microwave had an influence on the quality of the resulting film. If the pressure is too high, there arises a disadvantage that not only the resulting film becomes soft because the plasma electron temperature is lowered so that the reaction gas cannot be decomposed sufficiently but also the film-forming speed becomes slow because the discharge mode is changed from ECR discharge to microwave discharge so that the plasma density is lowered. On the other hand, if the pressure is too low, there arises a disadvantage that the quality of the resulting film is deteriorated because the electron temperature becomes high so that the reaction gas is decomposed excessively.

Accordingly, in this embodiment, the pressure range of the reaction gas in the condition that the protective film is formed is selected to be in a range of from $5\times10^{-4}$ [Torr] to $5\times10^{-3}$ [Torr].

Furthermore, the apparatus 1 is provided as a so-called coaxially introducing type microwave ECR plasma generator having a coaxially introducing portion 19. When a hydrocarbon gas is used as the reaction gas, carbon deposited on the neighborhood of the radial antenna 25 becomes electrically conductive so that the radial antenna 25 hardly functions as an antenna.

This is because of low interatomic bond energy as an attribute of the hydrocarbon gas. In hydrocarbon having interatomic bond energy of not less than 5 [eV], decomposition does not progress and the gas has electrically insulating characteristic until the gas becomes electrically conductive slag. Therefore, in this embodiment, hydrocarbon having interatomic bond energy of not less than 5 [eV] is used as the reaction gas so that the radial antenna 25 can function as an antenna to perform a good continuous operation even in the case where slag is deposited on the radial antenna 25.

As described above, in the film-forming method according to this embodiment, microwave generated by the microwave generating means 7 is radially propagated into the vacuum chamber 3 containing an inert gas introduced from the inert gas introducing portion 51, so that electron cyclotron resonance is generated by a magnetic field formed by the magnetic field forming means 21 constituted by the plurality of permanent magnets 21A to thereby generate plasma.

Further, a thin-film-forming reaction gas is introduced into the generated plasma from the reaction gas introducing portion 5A and is excited and ionized to thereby make a decomposing reaction. On the other hand, tho substrate 10 is carried to the neighborhood of the plasma by the substrate carrying means 9 while a bias voltage in applied onto the substrate 10 by the bias voltage applying means 11, so that a desired thin film is formed by a gas-phase reaction of the reaction gas.

Accordingly, also in the case where a high-molecular film is used as the substrate 10, the substrate 10 is less damaged and film-forming can be performed at a high speed particularly in a good condition of film thickness distribution in the widthwise direction.

Further, not only a metal layer formed from a ferromagnetic material is formed on the substrate 10 in advance so that a bias voltage is applied to the metal layer by the bias voltage applying means 11 but also the reaction gas is formed from hydrocarbon so that a protective film mainly containing carbon is formed. As a result, there arises an advantage that a higher-quality protective film is formed.

Further, not only the reaction gas is formed from hydrocarbon but also film-forming is performed while the pressure of the reaction gas in the condition that the protective film is formed is kept in a set range of from $5\times10^{-4}$ [Torr] to $5\times10^{-3}$ [Torr]. As a result, there arises an advantage that a protective film of further higher quality is formed.

Further, film-forming is performed by using hydrocarbon having a bonding portion in which interatomic bond energy as an attribute of the reaction gas introduced for the formation of a protective film is not less than 5 [eV], so that the function of the radial antenna 25 is kept proper. As a result, there arises an advantage that the process of forming the protective film is carried out efficiently and continuously for a long time.

EXAMPLES

The inventors of the present invention have made some experiments with respect to the protective film formation by means of the aforementioned apparatus 1. In the following, examples for the experiments will be described.

In this case, experiments were made in accordance with the following experimental environment conditions (1) to (6).

(1) Condition for Vacuum Chamber 3

There was used a vacuum chamber 3 of SUS304 having a volume of about 1 [m$^3$] and provided with one rotary pump having an evacuation rate of 3000 [l/min], one mechanical booster pump having an evacuation rate of 25000 [l/min] and two turbo pumps having an evacuation rate of 3000 [l/sec], To prevent microwave from leaking to the atmospheric side, 0.5 [mm] mesh-like SUS net wire was stuck to a window for observing the inside of the vacuum chamber 3, a tape having its surface coated with aluminum was stuck to joints of members constituting the vacuum chamber 3 and a PEN film was stuck to arc-generation portions.

(2) Condition for Gas Introducing Means 5

A mass flow controller with a maximum flow rate of from 200 [sccm] to 500 [sccm] was used and a SUS304 pipe with an inner diameter of 6 [mm] was used in the gas introducing portions 5A and 5B.

(3) Condition for Microwave ECR Plasma Generating Means 7

A microwave electric source with an oscillation frequency of 2.45 [GHz] and a maximum output of 1.5 [kW] was used for applying electric power in a range of from 0.8 [kW] to 1.2 [kW]. The plasma generating portion was shaped angularly and the width and length in the direction of carrying the web were selected to be 400 [mm] and 200 [mm] respectively.

A plurality of cylindrical SmCo magnets were used as the permanent magnets 21A and arranged in accordance with the shape of the plasma generating portion. The permanent magnets 21A, 21A were set so that the polarities of permanent magnets 21A, 21A adjacent radially from the center portion were reversed.

A quartz plate having a size of 400 [mm]×200 [mm] was used as the dielectric plate 23. The radial antenna 25 was formed from SUS304 and the diameter of the mount portion in the center portion was selected to be 40 [mm]. In the radial antenna 25, two rod portions each having a length of 80 [cm], four rod portions each having a length of 140 [cm] and two rod portions each having a length of 190 [cm] were used.

(4) Condition for Substrate Carrying Means 9

A substrate carrying means 9 having a delivery portion 27, a wind-up portion 29, a cooling drum 35, a pass roll 33 and an electrode roll 31 was used. In the substrate carrying means 9, there was employed a method of controlling carrying of the substrate 10 while controlling tension. The carrying speed was set to be in a range of from 0 [m/min] to 40 [m/min] and the tension was set to be in a range of from 0 [kg/width] to 6 [kg/width].

With respect to the cooling drum 35, an experiment in the condition that the temperature of the water-cooling drum was set to be in a range of from 15° C. to 40° C. and an experiment in accordance with the aforementioned carrying condition by using only the pass roll 33 without use of the cooling drum 35 were carried out respectively.

(5) Condition for Bias Voltage Applying Means

A DC pulse voltage modulated in a range of from 2 [kHz] to 20 [kHz] was applied, by a value in a range of from 0 [V] to 500 [V], to the surface of the substrate 10 through the electrode roll 31.

(6) Condition for Substrate Material and Gas Type

A plate formed by laminating, in advance, a Cr undercoat layer of 90 [nm] and a CoPtCr magnetic layer of 30 [nm] as a magnetic layer on a PEN base having a width of 300 [mm] and a thickness of 60 [μm] was used as the substrate 10.

Ar gap was used for generation of plasma and its flow rate was controlled to be in a range of from 0 [sccm] to 200 [sccm] by the mass flow controller.

Further, $C_2H_2$ or $C_6H_6$ was used as a hydrocarbon gas having a bonding portion with interatomic bond energy of not less than 5 [eV] whereas $CH_4$ was used as a hydrocarbon gas having no bonding portion with interatomic bond energy of not less than 5 [eV]. The flow rate in each of the hydrocarbon gases was controlled to be in a range of from 0 [sccm] to 500 [sccm] by the mass flow controller.

After experiments were carried out under the aforementioned film-forming conditions so that the film thickness of the diamond-like carbon film in each sample was formed by a value in a range of from 10 [nm] to 100 [nm], the samples were evaluated by the following methods (A) to (C) and Table 1 was generated.

(A) Evaluation of Film Thickness Distribution, Film-Forming Rate and Film Quality A section of each sample was observed by a TEM (transmission electron microscopy) so that $\delta=[(Max-Min)/(Max+Min)]\times 100$ was calculated on the basis of the maximum Max and the minimum Min in a widthwise direction. The result was made a function $\delta(\%)$ and the function $\delta(\%)$ was made a representative value of the film thickness distribution.

Further, the film-forming rate was calculated as rate=avg/(l/v) in which avg was a widthwise average, v was the web carrying speed and l was the length of the film-forming region in the web-carrying direction.

Further, the film quality was evaluated by plasmon loss energy measured by EsCA (Electron Spectroscopy for Chemical Analysis). When, for example, the energy was 27 [eV], the film quality was evaluated to be good.

(B) Evaluation of Durability against Scratch

Each sample was punched out into the form of a disk. After one and the same portion was rubbed with a hard disk magnetic head for one hour while the disk-like sample was rotated, the occurrence of any scratch was observed by an optical microscope. Thus, the durability against scratch was evaluated so that ○ was given to the case where there was no scratch, Δ was given to the case where there was some slight scratch and × was given to the case where there was some scratch.

(C) Environmental Durability

After each sample was cut into the form of a sheet and left under the environment of 60° C. and 90% for 72 hours, the corrosion of the magnetic film was observed by an optical microscope. Thus, the environmental durability was evaluated so that ○ was given to the case where there was no corrosion, Δ was given to the case where there was some slight corrosion and × was given to the case where there was some corrosion.

TABLE 1

| | Gas flow rate (sccm) | | Vacuum degree during film forming (Torr) | Plasmon loss energy (eV) | Durability against scratch | Environmental Durability |
|---|---|---|---|---|---|---|
| 1) | Ar | 20 | $2 \times 10^{-4}$ | 26.0 | Δ | Δ |
| | $C_2H_2$ | 50 | | | | |
| 2) | Ar | 50 | $5 \times 10^{-4}$ | 27.0 | ○ | ○ |
| | $C_2H_2$ | 100 | | | | |
| 3) | Ar | 100 | $8 \times 10^{-4}$ | 27.5 | ○ | ○ |
| | $C_2H_2$ | 200 | | | | |
| 4) | Ar | 100 | $1 \times 10^{-3}$ | 27.5 | ○ | ○ |
| | $C_2H_2$ | 250 | | | | |
| 5) | Ar | 100 | $3 \times 10^{-3}$ | 27.5 | ○ | ○ |
| | $C_2H_2$ | 300 | | | | |
| 6) | Ar | 100 | $5 \times 10^{-3}$ | 27.5 | ○ | ○ |
| | $C_2H_2$ | 400 | | | | |
| 7) | Ar | 100 | $8 \times 10^{-3}$ | 26.0 | Δ | Δ |
| | $C_2H_2$ | 500 | | | | |
| 8) | Ar | 100 | $1 \times 10^{-2}$ | 25.0 | × | × |
| | $C_2H_2$ | 500 | | | | |
| 9) | Ar | 20 | $2 \times 10^{-4}$ | 26.0 | Δ | Δ |
| | $C_2H_2$ | 50 | | | | |
| 10) | Ar | 50 | $5 \times 10^{-6}$ | 27.0 | ○ | ○ |
| | $C_2H_2$ | 100 | | | | |
| 11) | Ar | 100 | $8 \times 10^{-4}$ | 27.5 | ○ | ○ |
| | $C_2H_2$ | 200 | | | | |
| 12) | Ar | 100 | $1 \times 10^{-3}$ | 27.5 | ○ | ○ |
| | $C_2H_2$ | 250 | | | | |
| 13) | Ar | 100 | $3 \times 10^{-3}$ | 27.5 | ○ | ○ |
| | $C_2H_2$ | 300 | | | | |
| 14) | Ar | 100 | $5 \times 10^{-3}$ | 27.5 | ○ | ○ |
| | $C_2H_2$ | 400 | | | | |
| 15) | Ar | 100 | $8 \times 10^{-3}$ | 26.0 | Δ | Δ |
| | $C_2H_2$ | 500 | | | | |
| 16) | Ar | 100 | $1 \times 10^{-2}$ | 25.0 | × | × |
| | $C_2H_2$ | 500 | | | | |

Though not shown in Table 1, the following results (a) to (e) could be obtained.

(a) Though film thickness distribution varied in accordance with the film-forming condition, a good film thickness distribution was obtained in the condition $\delta=(3\%-10\%)$.

(b) Though the film-forming rate varied in accordance with the type of the reaction gas, the rate of 15 [nm/sec] was obtained in $C_2H_2$ gas and film-forming could be performed at a sufficiently high speed.

When $C_6H_6$ gas was used, the film-forming rate was increased to be a value of from twice to three times as much as the aforementioned value and film-forming could be performed at a high speed in the same manner as described above.

(c) In the case of $CH_4$ gas, the film-forming rate was reduced by a value in a range of from 20% to 40% in comparison between the point of time of the start of film-forming and the point of time of the completion of film-forming in 1000 [m] continuous film-forming. In the case of $C_2H_2$, there was no change of the film-forming rate even in 2000 [m] continuous film-forming.

(d) In the case where the film-forming portion and its vicinity were not coated with an electrically insulating member, arc occurred in the inner side wall of the vacuum chamber 3, the carrying means, etc. so that devices were damaged. In the case where the film-forming portion and its vicinity were coated with an electrically insulating member, there is no occurrence of arc.

(e) Even in the case where the cooling drum 35 was not used, a sample having less warp so as to be able to be put into practical use sufficiently could be generated.

As understood from the above description, in the film-forming apparatus according to the present invention, microwave radially propagated in the vacuum chamber makes electron cyclotron resonance with a magnetic field formed by the permanent magnets, so that plasma is generated to thereby perform film-forming.

Accordingly, even in the case where a web-like high-molecular film is used as the high-molecular substrate, the substrate is less damaged and film-forming can be performed at a high speed particularly in a good condition of film thickness distribution in the widthwise direction.

Further, in the film-forming apparatus according to the present invention, respective positions of the film-forming apparatus exposed to plasma contained in the generated plasma and having no contribution to film-forming and respective positions of the film-forming apparatus in which microwave contained in the microwave being generated by the microwave generating means and having no contribution to film-forming is propagated, are coated with an electrically insulating member so as to be protected.

Accordingly, even in the case where a high-molecular film is used as the substrate, the high-molecular substrate is less damaged and film-forming can be performed at a high speed particularly in a good condition of film thickness distribution in the widthwise direction and, in addition, the durability of the film-forming apparatus can be improved.

On the other hand, in the aforementioned film-forming method according to the present invention, microwave generated by the microwave generating means is radially propagated into the vacuum chamber containing the introduced inert gas to cause electron cyclotron resonance with the magnetic field formed by the permanent magnets to thereby generate plasma. A thin-film-forming reaction gas is introduced into the generated plasma by the gas introducing means and is excited and ionized to cause a decomposing reaction. On the other hand, the high-molecular substrate is carried to the neighborhood of the plasma by the high-molecular substrate carrying means while a bias voltage is applied onto the high-molecular substrate by the bias voltage applying means, so that a desired thin film is formed by a gas-phase reaction of the reaction gas.

Accordingly, even in the case where a high-molecular film is used as the high-molecular substrate, the high-molecular substrate is less damaged and film-forming can be performed at a high speed particularly in a good condition of film thickness distribution in the widthwise direction.

Further, in the aforementioned film-forming method according to the present invention, not only a metal layer formed from a ferromagnetic material is formed on the high-molecular substrate in advance so that the bias voltage is applied to the metal layer by the bias voltage applying means but also the reaction gas is formed from hydrocarbon so that the thin film mainly containing carbon is formed.

Accordingly, in addition to the merit that a higher-quality protective film is formed, even in the case where a high-molecular film is used as the high-molecular substrate, the high-molecular substrate is less damaged and film-forming can be performed at a high speed particularly in a good condition of film thickness distribution in the widthwise direction.

Further, in the aforementioned film-forming method according to the present invention, the reaction gas is formed from hydrocarbon and the pressure of the reaction gas in the condition in which the thin film is formed is preferably selected to be in a range of from $5 \times 10^{-4}$ [Torr] to $5 \times 10^{-3}$ [Torr]. That is, film-forming is performed while the pressure of the reaction gas is kept in the selected range. Accordingly, in addition to the merit that a higher-quality protective film is formed, even in the case where a high-molecular film is used as the high-molecular substrate, the high-molecular substrate is less damaged and film-forming can be performed at a high speed particularly in a good condition of film thickness distribution in the widthwise direction.

Further, in the aforementioned film-forming method according to the present invention, as the attribute of the reaction gas introduced for thin-film formation, hydrocarbon having a bonding portion of interatomic bond energy of not less than 5 [eV] is used for film-forming. Accordingly, the process of forming a thin film continuously can be kept well while avoiding the disadvantage that hydrocarbon reacts with an electrically insulating material. Furthermore, in addition to the merit that a higher-quality thin film can be formed, even in the case where a high-molecular film is used as the high-molecular substrate, the high-molecular substrate is less damaged and film-forming can be performed at a high speed particularly in a good condition of film thickness distribution in the widthwise direction.

What is claimed is:

1. A film-forming apparatus for making it possible to form a thin film on a web-like high-molecular film substrate, comprising:

a. a vacuum chamber provided with an evacuator;
   b. a gas introducing means for introducing a thin-film-forming gas into the vacuum chamber;
   c. a substrate carrying means for carrying said substrate to the neighborhood of said plasma generated by said plasma generating means;
   d. a bias voltage applying means for applying a desired bias voltage to said substrate; and,
   e. a plasma generating means for generating plasma in said vacuum chamber and comprising
      i. a microwave ECR plasma generating means including a microwave generating means for generating microwave,
      ii. a microwave introducing and propagating means for coaxially introducing the generated microwave into said vacuum chamber and radially propagating said microwave in said vacuum chamber,
      iii. permanent magnets provided in said vacuum chamber for forming a magnetic field to cause electron cyclotron resonance with said introduced and propagated microwave;
      iv. a dielectric plate provided in the vacuum chamber and disposed between the magnets and the substrate carrying means; and
      v. a radial antenna disposed between the dielectric plate and the substrate carrying means.

2. The film-forming apparatus according to claim 1 wherein the radial antenna is formed from a plurality of radially arranged antenna bodies.

3. The film-forming apparatus according to claim 2 wherein at least some of the antenna bodies have a length equal to an odd-number multiple of $\frac{1}{4}\lambda$ or $\frac{1}{8}\lambda$ where $\lambda$ is the wavelength of the microwave.

4. The film-forming apparatus according to claim 2 wherein the antenna bodies extend from a center of radiation of the antenna in at least one of four and eight directions.

* * * * *